US008268720B2

(12) United States Patent
Kamins et al.

(10) Patent No.: US 8,268,720 B2
(45) Date of Patent: Sep. 18, 2012

(54) METHOD OF POSITIONING CATALYST NANOPARTICLE AND NANOWIRE-BASED DEVICE EMPLOYING SAME

(75) Inventors: Theodore I. Kamins, Palo Alto, CA (US); Zhiyong Li, Redwood City, CA (US); Duncan R. Stewart, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1046 days.

(21) Appl. No.: 11/742,310

(22) Filed: Apr. 30, 2007

(65) Prior Publication Data

US 2010/0109101 A1  May 6, 2010

(51) Int. Cl.
*H01L 21/4763* (2006.01)
(52) U.S. Cl. ............ 438/622; 438/503; 977/900
(58) Field of Classification Search .......... 438/503, 438/960, 962, 597–688; 977/840–901
See application file for complete search history.

(56) References Cited

U.S. PATENT DOCUMENTS

| | | | |
|---|---|---|---|
| 6,448,701 B1 * | 9/2002 | Hsu | 313/309 |
| 6,803,840 B2 * | 10/2004 | Hunt et al. | 333/186 |
| 6,858,521 B2 | 2/2005 | Jin | |
| 6,958,572 B2 | 10/2005 | Merkulov et al. | |
| 7,098,056 B2 | 8/2006 | Demers | |
| 7,151,209 B2 | 12/2006 | Empedocles et al. | |
| 7,285,900 B2 * | 10/2007 | Yang et al. | 313/495 |
| 7,485,024 B2 * | 2/2009 | Pan et al. | 445/24 |
| 7,582,507 B2 * | 9/2009 | Hongo | 438/99 |
| 2004/0150311 A1 * | 8/2004 | Jin | 313/309 |
| 2005/0011431 A1 | 1/2005 | Samuelson et al. | |
| 2005/0095780 A1 * | 5/2005 | Gutsche et al. | 438/243 |
| 2005/0133254 A1 * | 6/2005 | Tsakalakos | 174/261 |
| 2006/0264039 A1 | 11/2006 | Cohen | |
| 2007/0072335 A1 * | 3/2007 | Baik et al. | 438/99 |
| 2008/0157363 A1 * | 7/2008 | Mayya Kolake et al. | 257/741 |
| 2010/0009474 A1 * | 1/2010 | Kim et al. | 438/20 |

OTHER PUBLICATIONS

Islam et al. Appl.Phys. A 80,1113-1140 (2005).*
Slam et al. Appl.Phys. A 80,1113-1140 (2005).*
Islam et al (Appl.Phys.A80,1113-1140(2005)).*
Islam et al (Appl.Phys.A80,1113-114-(2005)).*
Hong Jin Fan et al., "Semiconductor Nanowires: From Self-Organization to Patterned Growth", Small Journal, vol. 2, No. 6, Wiley InterScience, 2006, pp. 700-717.
Massood Tabib-Azar et al., "Mechanical properties of self-welded silicon nanobridges", Appl. Phys. Lett., 87, 2005, pp. 113102-1-1131023-3.
S. H. Kim et al., "Tunnel diodes fabricated from CdSe nanocrytal monolayers", Appl. Phys. Lett., vol. 74, No. 2, Jan. 11, 1999, pp. 317-319.
M. J. Graham, "Oxidation of III-V semiconductors", Corrosion Science, vol. 49, 2007, pp. 31-41.

* cited by examiner

*Primary Examiner* — Zandra Smith
*Assistant Examiner* — Ali Naraghi (57) ABSTRACT

A method of positioning a catalyst nanoparticle that facilitates nanowire growth for nanowire-based device fabrication employs a structure having a vertical sidewall formed on a substrate. The methods include forming the structure, forming a targeted region in a surface of either the structure or the substrate, and forming a catalyst nanoparticle in the targeted region using one of a variety of techniques. The techniques control the position of the catalyst nanoparticle for subsequent nanowire growth. A resonant sensor system includes a nanowire-based resonant sensor and means for accessing the nanowire. The sensor includes an electrode and a nanowire resonator. The electrode is electrically isolated from the substrate. One or more of the substrate is electrically conductive, the nanowire resonator is electrically conductive, and the sensor further comprises another electrode. The nanowire resonator responds to an environmental change by displaying a change in oscillatory behavior.

16 Claims, 7 Drawing Sheets

METHOD OF POSITIONING CATALYST NANOPARTICLE AND NANOWIRE-BASED DEVICE EMPLOYING SAME

STATEMENT REGARDING FEDERALLY SPONSORED RESEARCH OR DEVELOPMENT

N/A

BACKGROUND

1. Technical Field

The invention relates to nanotechnology. In particular, the invention relates to positioning catalyst nanoparticles for catalytic nanowire growth.

2. Description of Related Art

A consistent trend in semiconductor technology since its inception is toward smaller and smaller device dimensions and higher and higher device densities. As a result, an area of semiconductor technology that recently has seen explosive growth and generated considerable interest is nanotechnology. Nanotechnology is concerned with the fabrication and application of so-called nano-scale structures, structures having at least one linear dimension between 1 nm and 200 nm. These nano-scale structures are often 5 to 100 times smaller than conventional semiconductor structures.

A nanowire is an example of a nano-scale structure. A nanowire is an individual quasi-one dimensional, nano-scale, single crystalline structure typically characterized as having two spatial dimensions or directions that are much less than a third spatial dimension or direction. The presence of the third, greater dimension in nanowires facilitates electron flow along that dimension while conduction is limited, and may be quantized, in the other two spatial dimensions.

Nanowires provide useful building blocks in making nano-scale devices. However, techniques for positioning nanowires in particular locations on surfaces in order to make nano-scale devices have not been one or more of reliable, reproducible or amenable to a manufacturing environment.

BRIEF SUMMARY

In some embodiments of the present invention, a method of positioning a catalyst nanoparticle on a surface for nanowire growth is provided. The method comprises forming a structure on a substrate. The structure has a sidewall that extends vertically from the substrate. The method of positioning further comprises forming a targeted region on a respective surface of either the sidewall of the structure or the substrate using one of a metal oxide layer, a selectively removable passivation layer and a selectively removable sacrificial layer; and forming a catalyst nanoparticle in the targeted region.

In other embodiments of the present invention, a method of positioning a catalyst nanoparticle to grow a nanowire is provided. The method of positioning comprises concurrently forming both a targeted region and a catalyst nanoparticle in the targeted region on a respective surface of either a substrate or a vertical sidewall of a structure on the substrate using controlled deposition to provide a catalyst nanoparticle in the targeted region. The method of positioning further comprises growing a nanowire in the targeted region using the formed catalyst nanoparticle.

In other embodiments of the present invention, a resonant sensor system is provided. The resonant sensor system comprises a nanowire-based resonant sensor. The sensor comprises a substrate, a first electrode on the substrate, and a nanowire resonator with a controlled surface extending from a targeted region of either the substrate or the first electrode. The first electrode is electrically isolated from the substrate. The resonant sensor system further comprises means for accessing the nanowire resonator. The means for accessing is electrically connected to at least the first electrode of the nanowire-based resonant sensor. One or more of (a) the substrate is electrically conductive, (b) the nanowire resonator is electrically conductive, and (c) the nanowire-based resonant sensor further comprises a second electrode that is spaced from the first electrode. The nanowire resonator responds to a change in an environment of the nanowire resonator by displaying a change in oscillatory behavior. The change in the environment comprising one or both of surface adsorption and surface desorption.

Certain embodiments of the present invention have other features that are one or both of in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Embodiments of the present invention employ a structure that facilitates positioning of a catalyst nanoparticle for nanowire growth. The structure has a sidewall that extends vertically from a surface of a substrate. The structure becomes a portion of a nanowire-based device. Depending on the embodiment, the catalyst nanoparticle is positioned on a surface of either the sidewall of the structure or the substrate in a targeted region. Further, a nanowire may be grown predominantly perpendicular from the respective surface using the positioned catalyst nanoparticle for catalytic nanowire growth, depending on the embodiment. As such, either vertically extending nanowires or laterally extending nanowires may be grown to form the nanowire-based device.

As used herein, the article 'a' is intended to have its ordinary meaning in the patent arts, namely 'one or more'. For example, 'a nanowire' means 'one or more nanowires' and as such, 'the nanowire' means 'the nanowire(s)' herein. Moreover, any reference herein to 'top', 'bottom', 'upper', 'lower', 'left' or 'right' is not intended to be a limitation herein. Examples provided herein are intended to be illustrative only and are presented for discussion purposes and not by way of limitation.

In some embodiments of the present invention, the nanowire-based device comprises the structure on a substrate and a nanowire. In some embodiments, the device structure has either a single clamped nanowire or a double clamped nanowire. The nanowire-based device includes, but is not limited to, an electron emitter, an interconnect, a periodic photonic structure, an optical emitter, an optical detector, a sensor and a transistor. The nanowire is either an active element or a passive element of the device depending on the device application and in some embodiments, the structure on the substrate is an electrode. In some embodiments, the nanowire-based device is a resonant sensor, wherein the nanowire is a resonant element (i.e., resonator) of the resonant sensor. One or both of oscillations in the nanowire resonator are induced and changes in oscillations are detected.

In some embodiments of the nanowire-based device, the nanowire extends vertically from a targeted region on the substrate surface and is spaced from the structure. In other embodiments, the nanowire extends laterally from a targeted region on the sidewall of the structure spaced from the substrate surface. In some embodiments, the nanowire has one end anchored to the respective surface and an opposite end that is free (i.e., 'single-clamped'). In other embodiments, the nanowire may be anchored at both ends to spaced apart adjacent surfaces (i.e., 'double clamped'). For example, a laterally extending nanowire may connect between a pair of adjacent structures. In some of these embodiments of the nanowire-based device, the pair of structures is an electrode pair.

In some embodiments, each of the nanowire, the structure and the substrate is independently a semiconductor material. In some embodiments, the substrate is a bulk semiconductor wafer. In other embodiments, the substrate is a semiconductor layer on a support that is usually insulating (e.g., an oxidized silicon wafer). An example of a substrate that is a semiconductor layer on a support is a semiconductor-on-insulator wafer that comprises a handle wafer, an insulator layer on the handle wafer, and the semiconductor layer on the insulator layer, wherein the semiconductor layer has a horizontal planar surface. In other embodiments, the substrate is an insulator material. In some embodiments, the structure is formed from the semiconductor layer of the semiconductor-on-insulator wafer and the substrate is the insulator layer and the underlying semiconductor handle wafer of the semiconductor-on-insulator wafer.

The semiconductor materials independently include, but are not limited to, group IV, group III-V and group II-VI semiconductor materials, including compound semiconductor materials, from the Periodic Table of the Elements, or another semiconductor material that forms any crystal orientation. For example, and not by way of limitation, the semiconductor layer may be a silicon-on-insulator (SOI) wafer with a (111)-oriented silicon layer (i.e., top layer), or a single, free-standing wafer of (111) silicon, depending on the embodiment. An insulator material useful for the various embodiments of the invention is any material that is capable of being made insulating including, but not limited to, a semiconductor material from the groups listed above, or another semiconductor material, or can be an inherently insulating material. Moreover, the insulator material may be an oxide, a carbide, a nitride or an oxynitride of any of those semiconductor materials, such that insulating properties of the material are facilitated. The semiconductor materials that are rendered electrically conductive, according to some embodiments herein, are doped to impart a targeted amount of electrical conductivity (and possibly other characteristics) depending on the nanowire-based device application.

Figure 1:
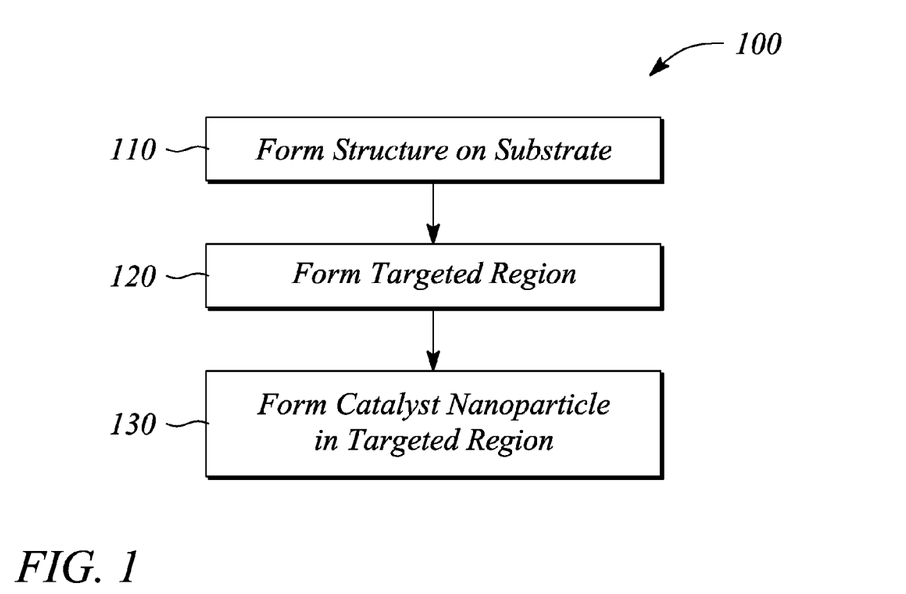
FIG. 1 illustrates a flow chart of a method of positioning a catalyst nanoparticle according to an embodiment of the present invention.

The catalyst nanoparticle is positioned in a targeted region using a variety of techniques. FIG. 1 illustrates a block diagram of a method 100 of positioning a catalyst nanoparticle on a surface for nanowire growth. The method 100 of positioning a catalyst nanoparticle comprises forming 110 a structure on a substrate. The structure has a sidewall that extends vertically from a surface of the substrate. In some embodiments, a pair of the structures is formed essentially parallel to one another and spaced apart on the substrate surface. In some embodiments, the pair of structures mimics a channel or trench on the substrate. In other embodiments, the pair of structures mimics adjacent posts or pillars on the substrate. The spacing between the vertical sidewalls of adjacent structures (or the structure pair) is dependent on the ultimate application for a particular nanowire-based device and not considered a limitation herein.

In some embodiments, the structure is formed 110 on the substrate using a lithography technique and etching. One or both of wet chemical etching and dry etching may be used in forming 110 the structure. Moreover, in some embodiments, either a surface of the vertical sidewall or the surface of the substrate has a surface irregularity. A surface irregularity includes, but is not limited to, a surface protrusion, such as a ridge or a ledge, and a surface depression, such as a groove or a crater. Such surface irregularities may be deliberately induced in a predetermined location, or may result as a consequence of an etching process, according to various embodiments. For example, the surface irregularity may be formed using a lithographic technique, such as photolithography, followed by wet etching.

The method 100 of positioning further comprises forming 120 a targeted region on a respective surface of either the structure or the substrate; and forming 130 a catalyst nanoparticle in the targeted region. In some embodiments, forming 120 a targeted region comprises coating one or both of the vertical sidewall of the structure and the substrate surface with a layer of a metal oxide. Any of a variety of deposition or coating techniques may be used to apply the metal oxide layer coating. In these embodiments, forming 130 a catalyst nanoparticle comprises reducing a predetermined area of the metal oxide layer to a metal using a fine-scale lithographic technique and in a reducing atmosphere. In some embodiments, reducing a predetermined area of the metal oxide layer comprises using electron beam lithography or a laser to controllably reduce minute locations of the metal oxide to the respective metal in the targeted region. The metal in the predetermined area essentially is the formed catalyst nanoparticle in the targeted region. In some embodiments, forming 130 a catalyst nanoparticle further comprises annealing the metal to one or both agglomerate the metal into the catalyst nanoparticle in the targeted region or improve adhesion of the catalyst nanoparticle to the respective surface, for example.

In some embodiments, the method 100 of positioning further comprises removing areas of metal oxide that surround the metal catalyst nanoparticle using selective etching. Either wet chemical etching or dry etching may be used to selectively remove the surrounding areas of metal oxide.

In an example, a layer of platinum oxide ($PtO_2$) is coated on a surface of a vertical sidewall of the structure. Locations within the targeted region of the $PtO_2$ layer on the vertical sidewall are controllably reduced to platinum (Pt) metal with one or more of a fine-scale lithographic process, an electron beam, and a laser. The Pt metal locations in the targeted region provide the catalyst nanoparticles for subsequent nanowire growth on the vertical sidewall. In some embodiments, surrounding areas of $PtO_2$ are removed from the Pt catalyst locations, for example using sulfuric acid to dissolve $PtO_2$, which selectively etches $PtO_2$ but not the Pt. In another example, a layer of titanium oxide ($TiO_2$) is applied to the surface and selectively reduced in the targeted region as provided above, such that the remaining catalyst material is titanium (Ti). An isotropic dry etching technique may be used to remove surrounding areas of $TiO_2$ in the targeted region.

Figure 2:
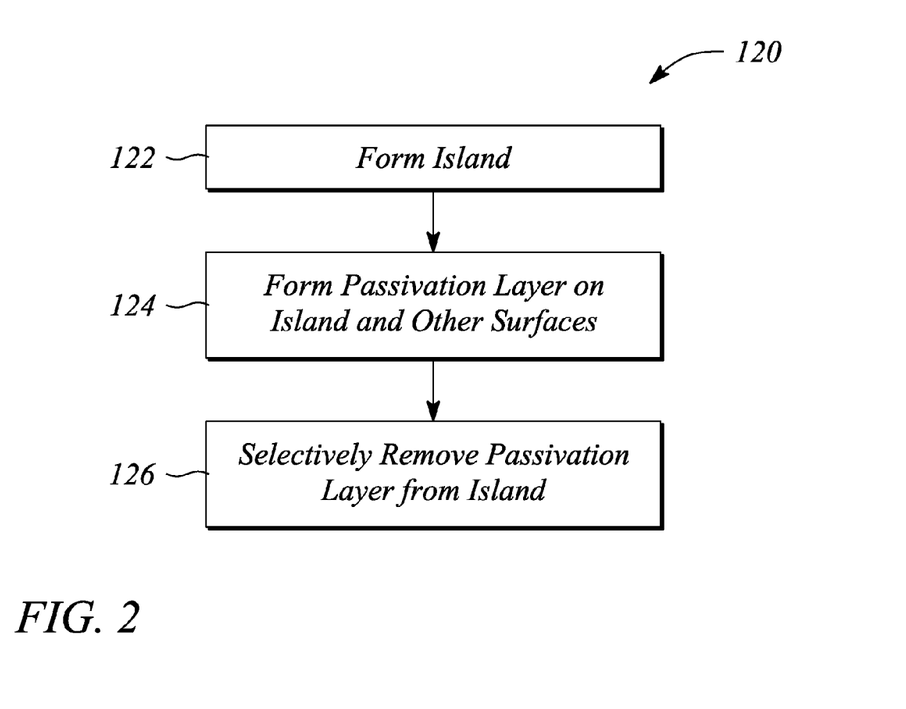
FIG. 2 illustrates a flow chart of a technique of forming a targeted region of FIG. 1 according to an embodiment of the present invention.

FIG. 2 illustrates a block diagram of a technique of forming 120 a targeted region according to another embodiment of the present invention. In this embodiment, forming 120 a targeted region first comprises forming 122 an island of a material on either a surface of the sidewall or the substrate surface. In some embodiments, the respective surface comprises a surface irregularity, as described above. In these embodiments, the island of material is preferentially formed 122 along or on the surface irregularity. Forming 122 an island of a material comprises depositing a wetting layer comprising a number of monolayers of the island material on the respective surface. The number of monolayers in the wetting layer depends on the lattice mismatch between the island material and the respective material on which the wetting layer and the island are formed 122 (i.e., either the structure material or the substrate material, depending on the embodiment). For example, for a large lattice mismatch, the number of monolayers may be vanishingly small.

Forming 122 an island further comprises subsequently depositing an additional number of monolayers of the island material on the wetting layer. For example, for about a 4% lattice mismatch of germanium on silicon, about 3-5 monolayers of a germanium island material is first deposited to form the wetting layer, followed by about 1-5 additional monolayers of germanium being subsequently deposited thereon to form the island (or island layer). The island material is different from the respective materials of the structure and of the substrate. Moreover, the island material is selected to have a lattice mismatch relative to a lattice(s) of the structure and the substrate. A mechanical strain from lattice mismatched materials facilitates island formation. In some embodiments, the strain is greater than zero percent but less than ten percent to form the island. In some embodiments, the island material is chosen to have a larger lattice parameter than the material of the respective surface. The larger lattice parameter facilitates formation of 3-dimensional structured islands disposed over the respective surface.

Forming 120 a targeted region further comprises forming 124 a passivation layer on both the island and the respective surfaces of the structure and the substrate. The passivation layer has different properties on each of the island and the respective surfaces (i.e., a 'differential' passivation layer). The different properties facilitate selective removal of the passivation layer. A number of materials with differential characteristics on the respective surfaces may be used herein for the passivation layer. In some embodiments, the passivation layer is an oxide layer. The oxide layer also may be referred to herein as 'a differential oxide layer' due to the different materials of the island and the respective surfaces on which the oxide is formed. For simplicity of discussion and not by way of limitation, the passivation layer will be described herein in terms of an oxide layer embodiment.

Forming 124 a passivation layer comprises exposing the island and the surfaces to air (or another oxidizing agent) at a suitable temperature such that a surface oxide is formed on the island, but the island is not completely oxidized through its thickness. In contrast, regions of the wetting layer surrounding the islands are completely oxidized, and a stable oxide layer is formed on the surfaces of the structure and the substrate. Since the island material is different from the respective materials of the structure and the substrate, the formed 124 island passivation layer (e.g., oxide layer) is characteristically different from the formed 124 passivation layer (e.g., oxide layer) on the other surfaces. In some embodiments, the island material is further chosen for its ability to form an oxide that is less stable than the oxide of the respective materials of the other surfaces.

Forming 120 a targeted region further comprises selectively removing 126 the passivation layer from the island while leaving the passivation layer on the other surfaces. In some embodiments, a wet chemical etching technique is used to selectively remove 126 the passivation layer from the island. As a result, the island is readied to receive a catalyst nanoparticle according to this embodiment of the method 100 of positioning.

In an example, the substrate material and the structure material are silicon and the island material is germanium. In this example, forming 124 a passivation layer on the island produces a germanium oxide. The germanium wetting layer is oxidized through its entire thickness, and the surface of the underlying silicon is oxidized either during the initial oxidation or after the germanium oxide is removed during subsequent processing. Consequently, the resulting structure includes germanium oxide on the germanium islands and silicon oxide formed on the region between islands. Germanium oxide is less stable than silicon oxide. Moreover, germanium oxide is soluble in water while silicon oxide is not. Therefore, the germanium oxide may be selectively removed 126 using water as the selective wet chemical removal agent. The silicon oxide on the surfaces of the structure and the substrate remains intact after exposure to water.

Forming 130 a catalyst nanoparticle according to this embodiment comprises selectively depositing a metal catalyst on the passivation-removed surface of the island to the exclusion of passivation-covered surfaces of the structure and the substrate. In effect, the passivation-covered (e.g., oxide-covered) surfaces act as a mask that surrounds an exposed island. In some embodiments, selectively depositing a metal catalyst comprises depositing a metal from solution using electrochemical deposition. Either electrodeposition or electroless deposition may be used to selectively deposit the metal from solution. In the vicinity of the island, the metal selectively deposits as a metal particle on the surface of the exposed island but does not deposit on the passivation covered surfaces. For the purposes of the embodiment herein, the metal particle is a catalyst nanoparticle formed 130 on the island to enable subsequent catalytic nanowire growth. In some embodiments, the deposited metal is annealed to one or both of form the catalyst nanoparticle on the island and improve properties of the catalyst nanoparticle for subsequent nanowire growth.

Electrodeposition uses a counter electrode, an external voltage source, and an electrodeposition bath that includes the metal ion in solution to be deposited as the metal particle. The island is electrically conductive and effectively acts as a receiving electrode. Electrodeposition electrochemically deposits the metal on the electrically conductive island using an applied voltage.

In electroless deposition, metal ions in solution electrochemically deposit as metal particles onto the essentially passivation-free island surface in a reduction-oxidation (redox) reaction without a need for any of a counter electrode, an applied voltage or a current resulting from the applied voltage. Moreover, the island may be either electrically conductive or semiconductive, for example, and may be either electrically connected or electrically isolated for electroless deposition. In some electroless deposition processes, an external reducing agent is introduced into the solution to facilitate the redox reaction (e.g., autocatalytic and substrate catalyzed processes). In other electroless deposition processes, no external reducing agent is used (e.g., surface-mediated or galvanic displacement process).

Figure 3A:
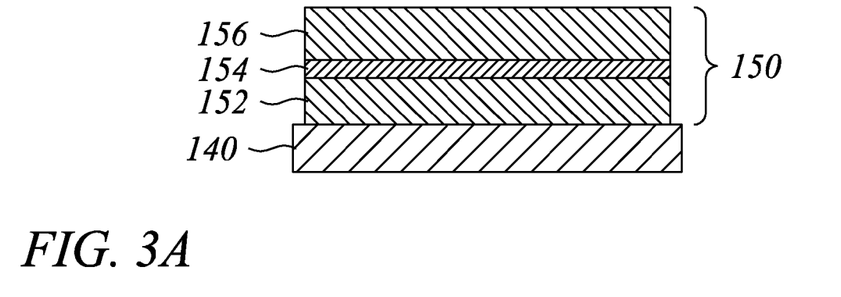
FIGS. 3A-3E illustrate side views of a device structure during positioning a catalyst nanoparticle of the method in FIG. 1 according to an embodiment of the present invention.

FIGS. 3A-3E illustrate side views of a device structure during the method 100 of positioning a catalyst nanoparticle according to another embodiment of the present invention. In this embodiment of the method 100, forming 110 a structure comprises forming a stack of different material layers on the substrate. FIG. 3A illustrates a side view of a stack 150 of different material layers formed on a substrate 140 surface in the fabrication of a nanowire-based device according to some embodiments. Referring to FIG. 3A, a first layer 152 is formed adjacent to the substrate 140 surface; a second layer 154 is formed on the first layer 152; and a third layer 156 is formed on the second layer 154. The second layer 154 is effectively sandwiched between the first layer 152 and the third layer 156.

In some embodiments, a thickness of the second layer 154 is different from a thickness of at least the first layer 152. The thicknesses of the respective layers are predetermined and controlled during forming. A thickness of the second layer 154 delineates the targeted region (as provided below). In some embodiments, the thickness of the first layer 152 represents a height above which is the targeted region on the sidewall of the structure. In some of these embodiments, the thickness of the second layer 154 is thinner than the thickness of at least the first layer 152 to further define the targeted region, as illustrated in FIG. 3A. Moreover, the material of the second layer 154 is different from the materials of the first layer 152, the third layer 156, and the substrate 140 material. The first layer 152 material and the third layer 156 material may be the same or different. For example, the substrate may be an insulator material, such as silicon oxide or silicon dioxide, or the substrate may be one or both of a semiconductor material and an insulator material. The first, second and third layers may be independently semiconductor materials. In this example, the second layer semiconductor material is different from the semiconductor materials of the other layers and the substrate. Moreover, one or both of the first layer 152 material and the third layer 156 material may be either the same as or different from the substrate 140 material.

Figure 3B:
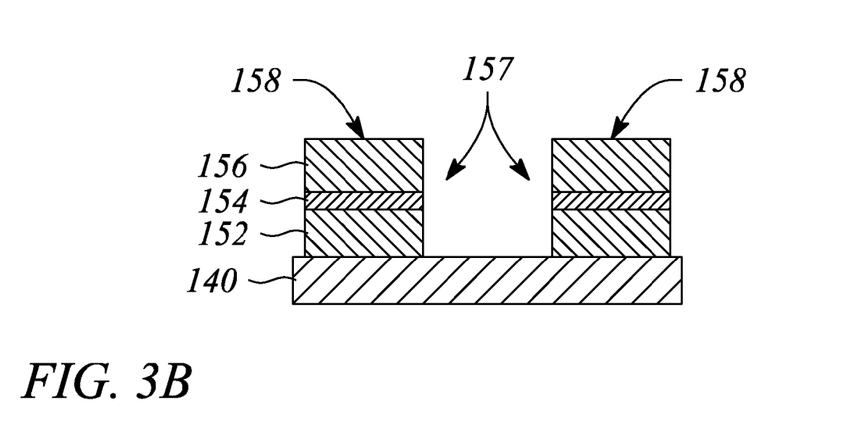

According to this embodiment, forming 110 a structure further comprises forming the structure in the stack 150 of material layers. As mentioned above, the structure is formed 110 using a lithography technique and etching. FIG. 3B illustrates a side view of a pair of structures 158 formed in the stack 150 of layers of FIG. 3A according to some embodiments. As illustrated, each structure 158 has a vertical sidewall 157 with end surfaces of the respective layers 152, 154, 156 of the different materials in the stack 150 exposed. Also, the substrate 140 surface is exposed as a result of forming the structure 158. FIG. 3B illustrates a pair of structures 158 that is formed in the stack 150 by way of example.

The method 100 of positioning a catalyst nanoparticle further comprises forming 120 a targeted region on the structure 158 formed in FIGS. 3A and 3B according to this embodiment. In this embodiment, forming 120 a targeted region comprises forming a passivation layer on the exposed surfaces of the respective layers 152, 154, 156 of the structure's 158 vertical sidewall 157 and optionally on the substrate 140; and selectively removing the passivation layer from the end surface of the second layer 154 to the exclusion of the passivation-coated surfaces of the first layer 152, the third layer 156, and the substrate. The passivation layer has different properties on each of the respective surfaces (i.e., a 'differential' passivation layer). The different properties facilitate selective removal of the passivation layer.

A number of materials with differential characteristics on the respective surfaces may be used herein for the passivation layer. In some embodiments, the passivation layer is an oxide layer. The oxide layer also may be referred to herein as 'a differential oxide layer' due to the different materials of the respective layers or surfaces on which the oxide is formed. For simplicity of discussion and not by way of limitation, the passivation layer will be described in terms of an oxide layer embodiment.

In some embodiments, the substrate 140 is an insulating oxide material such that the exposed surface thereof is already an oxide. In other embodiments, the substrate 140 is a semiconductor material and an oxide is formed on the exposed surface of the substrate 140 when the oxide is formed on the exposed surfaces of the sidewall 157.

Figure 3C:
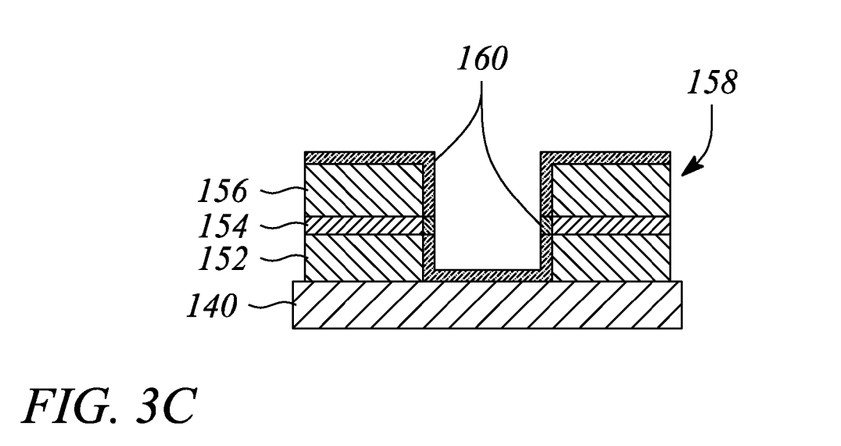

FIG. 3C illustrates a side view of passivation layer (e.g., oxide layer) 160 formed on the exposed surfaces of FIG. 3B according to some embodiments. The oxide layer 160 is formed by exposing the surfaces to air (or another oxidizing agent), for example. For this embodiment, using a different material for the second layer 154 relative to the material(s) of the first layer 152, the third layer 156 and the substrate 140 ensures that the formed oxide layer of the second layer 154 material is different from the oxides formed on the first layer 152 and the third layer 156, respectively, as well as the oxide on the substrate 140.

Concomitant to being a different oxide, the formed oxide of the second layer 154 has solubility characteristics that distinguish the second layer 154 oxide from the oxide formed on the first and third layers 152, 156 and the substrate 140 for the purposes of selective removal of the second layer 154 oxide. In some embodiments, the material of the second layer 154 is further chosen for its ability to form a less stable oxide than the oxide formed on the respective materials of the first layer and the third layer and the substrate 140. The less stable oxide is more readily removable than a stable oxide.

Figure 3D:
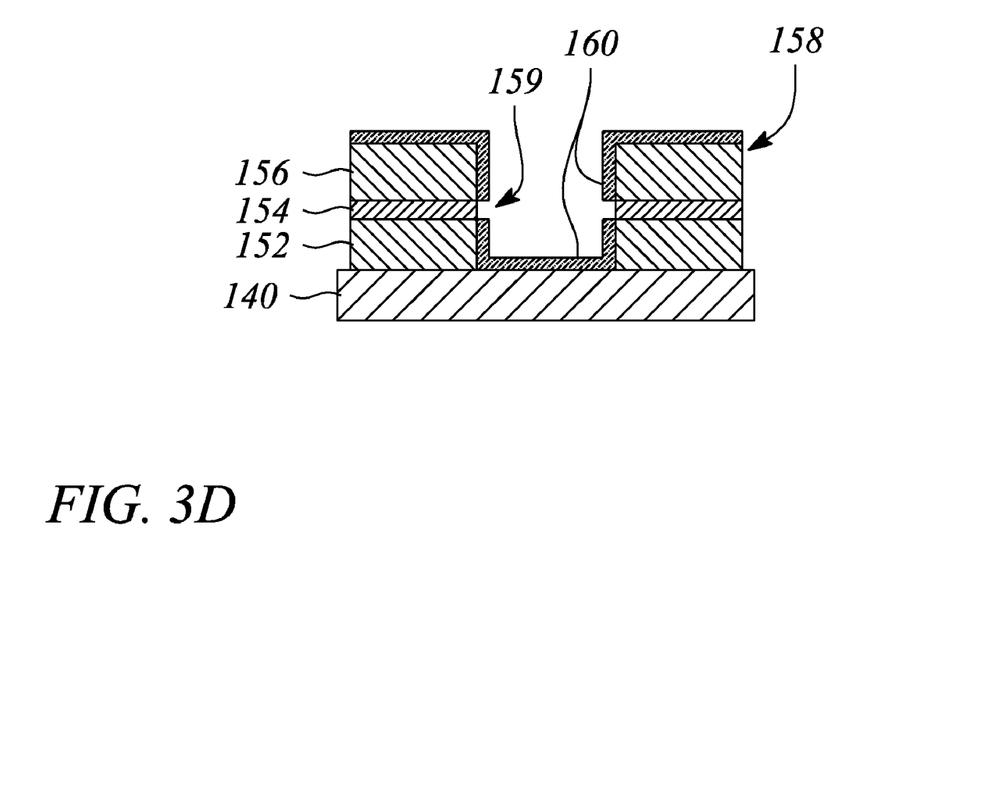

FIG. 3D illustrates a side view of a selectively removed passivation layer (e.g., oxide) from the end surface of the second layer 154 of the vertical sidewall 157 of the structure 158 of FIG. 3C according to some embodiments. The oxide is selectively removed to the exclusion of the oxide on the substrate 140 surface and the first and third layers 152, 156. The end surface of the oxide-free second layer 154 is the formed 120 targeted region 159.

For example, the material of the first layer 152 and the third layer 156 may be silicon, and the substrate 140 may be silicon or silicon covered with silicon dioxide, while the material of the second layer 154 is germanium. As mentioned above, germanium oxide is soluble in water while silicon oxide is not. Moreover, germanium oxide is a less stable oxide relative to silicon oxide, for example. Therefore, water will selectively dissolve germanium oxide while leaving silicon oxide intact. In some embodiments, the different materials of the stacked structure independently each may be a semiconductor from Group IV or a compound semiconductor from any of Group III-V and II-VI. For example, gallium arsenide (GaAs) and aluminum gallium arsenide (AlGaAs) may be used for the respective layers. The materials are chosen for the reasons described above including, but not limited to, one or more of the material readily oxidizing, for example in air (or using another oxidizing agent); the oxidized materials having distinguishable solubilities for selective removal of the second layer oxide; the oxide of the second layer being less stable for selective removal than the oxide of the first and third layers; different thicknesses of oxide on different materials for selective removal of the second layer oxide; and the lattice structure of the second layer material being oriented for predominately lateral nanowire growth.

Figure 3E:
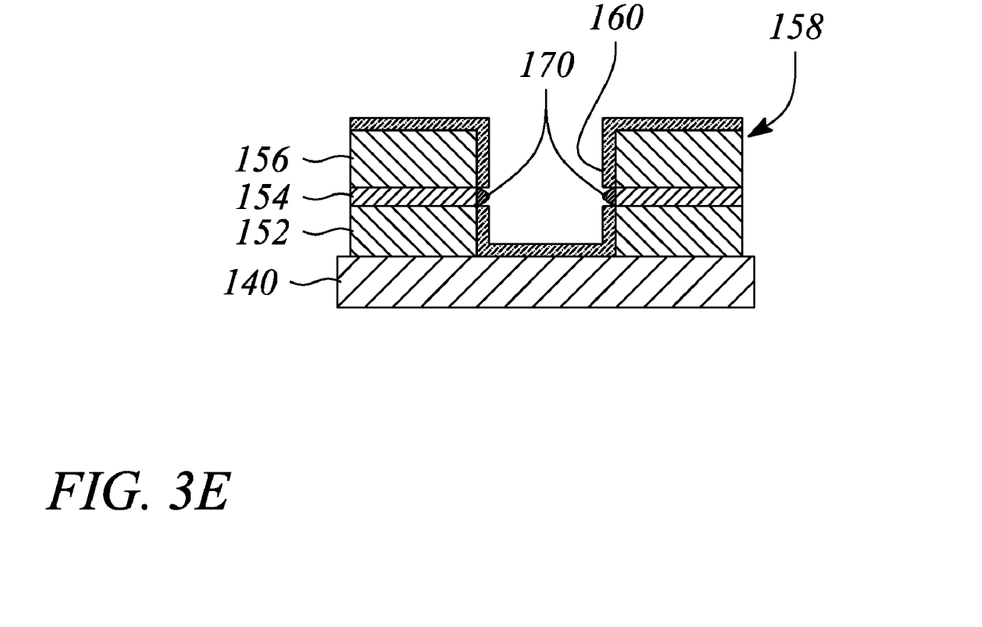

The method 100 of positioning a catalyst nanoparticle further comprises forming 130 a catalyst nanoparticle using selective deposition. According to this embodiment, forming 130 a catalyst nanoparticle comprises selectively depositing a metal catalyst on the passivation-free surface of the second layer 154 (i.e., the formed targeted region 159) to the exclusion of passivation-covered surfaces of the first and third layers 152, 156 and the substrate 140. In effect, the passivation-covered surfaces act as a mask that surrounds the exposed end surface of the second layer 154. In some embodiments, selectively depositing a metal catalyst comprises depositing a metal from solution using electrochemical deposition as described above. FIG. 3E illustrates a side view of a catalyst nanoparticle 170 formed on the passivation-free end surface of the second layer 154 of FIG. 3D (i.e., the formed targeted region 159), according to some embodiments. In some embodiments, the passivation layer 160 remaining on some or all of the other surfaces may be optionally removed after the metal catalyst is selectively deposited.

In other embodiments of the method 100 of positioning, forming 120 a targeted region comprises using a lithography technique to define the region targeted to receive a catalyst nanoparticle. In some of these embodiments, forming 120 a targeted region comprises applying a resist layer to respective surfaces of the substrate and the structure; and exposing the targeted region in the resist layer using electron beam lithography. Electron beam lithography has good depth of focus. In other of these embodiments, forming 120 a targeted region comprises coating the respective surfaces with a photosensitive resist layer; and using optical lithography to form the targeted region. In this embodiment, light from a source having a limited depth of focus is incident on the photosensitive resist layer in the targeted region. Regions where light is out of focus have less exposure and are not removed during development of the resist. This is especially the case where the photosensitive resist has a threshold exposure dose. As such, advantage is taken of the limited depth of focus of the light.

In some of these embodiments of the method 100 of positioning, forming 130 a catalyst nanoparticle in the targeted region comprises depositing a catalyst either before or after applying the resist layer, depending on the embodiment. The catalyst is deposited using a deposition technique including, but not limited to, chemical vapor deposition, evaporation and sputtering, for example. Forming 130 a catalyst nanoparticle in the targeted region further comprises removing the catalyst except for in the targeted region. In some embodiments, the catalyst is deposited after the resist layer is applied, such that removal of the resist layer also removes the catalyst thereon, while the catalyst in the targeted region remains intact. In some embodiments, the resist layer is removed using a lift-off technique wherein any of the catalyst that is on the resist layer is lifted-off with the resist layer removal.

In some embodiments, forming 120 a targeted region comprises first depositing the catalyst on the respective surfaces of the substrate and the structure. After the catalyst is deposited, then the respective surfaces are coated with the resist layer. In these embodiments, forming 130 a catalyst nanoparticle in the targeted region comprises removing the resist layer except for the targeted region. As such, the catalyst in the targeted region remains covered and protected by the resist layer. Forming 130 a catalyst nanoparticle in the targeted region further comprises removing the catalyst material from underneath the removed resist layer. As such, the catalyst in the targeted region remains intact. In these embodiments, the catalyst nanoparticle is formed 130 in the targeted region of either of the structure or the substrate.

In some embodiments, the catalyst remaining in the targeted region is annealed to agglomerate the catalyst into nanoparticles. Annealing is performed in a controlled environment. The annealed catalyst one or more of changes shape (e.g., is pulled into nanoparticles by surface tension), is activated, and becomes a nucleating catalyst in the targeted region. In other embodiments, the catalyst is deposited in an activated, nucleating nanoparticle form and therefore, annealing is optional. For example, annealing removes any surface contaminates that may be present on the respective surfaces. The terms 'catalyst' and 'catalyst nanoparticle' may be used interchangeably to refer to the end result (i.e., a nucleating catalyst nanoparticle for nanowire growth) herein unless a distinction is warranted.

Figure 4A:
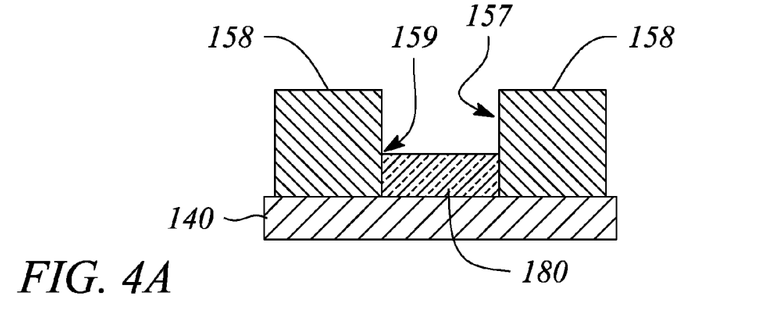
FIGS. 4A-4D illustrate side views of a device structure during forming a targeted region and forming a catalyst nanoparticle of the method in FIG. 1 according to an embodiment of the present invention.

In another embodiment of the method 100 of positioning a catalyst nanoparticle, forming 120 a targeted region employs a sacrificial layer to form the targeted region on the vertical sidewall of the structure. FIGS. 4A-4D illustrate side views of a device structure during forming 120 a targeted region and forming 130 a catalyst nanoparticle of the method 100 in FIG. 1 on a sidewall of the structure according to an embodiment of the present invention. In this embodiment, forming 120 a targeted region comprises forming a sacrificial layer on the substrate surface against a vertical portion of the sidewall of the structure. FIG. 4A illustrates a side view of the formed sacrificial layer 180 on the substrate 140 surface between a pair of structures 158 according to some embodiments.

The sacrificial layer 180 is formed with a predetermined thickness that represents a height above which is the targeted region 159 on the sidewall 157 measured from the substrate 140 surface. In some embodiments, the sacrificial layer is formed on the substrate 140 surface to a thickness in excess of the predetermined thickness. In these embodiments, the sacrificial layer is etched back using anisotropic etching, for example reactive ion etching (RIE), to remove material of the sacrificial layer to a certain depth that represents the predetermined thickness or height.

Figure 4B:
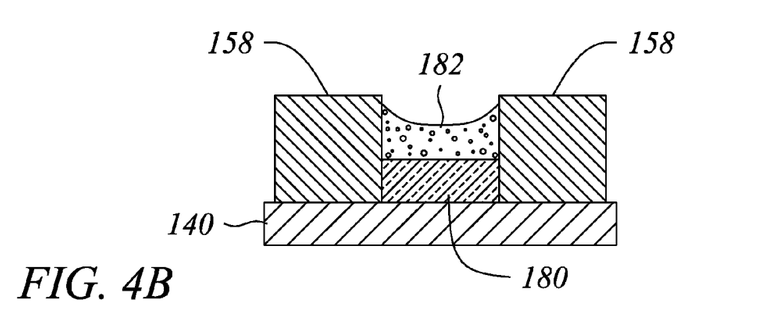

Further according to this embodiment of the method 100 of positioning, forming 130 a catalyst nanoparticle in the targeted region comprises introducing a catalyst in a carrier fluid adjacent to the sidewalls and the sacrificial layer. FIG. 4B illustrates a side view of the introduced catalyst in a carrier fluid 182 on the sacrificial layer 180 of FIG. 4A according to some embodiments. In some embodiments, the catalyst in a carrier fluid 182 comprises either catalyst material or nanoparticles that are suspended by a carrier fluid. In other embodiments, the catalyst in a carrier fluid 182 comprises a solution of catalyst ions dissolved in the carrier fluid (e.g., metal ions). In some embodiments, the catalyst in a carrier fluid 182 is a colloidal suspension of the catalyst.

Figure 4C:
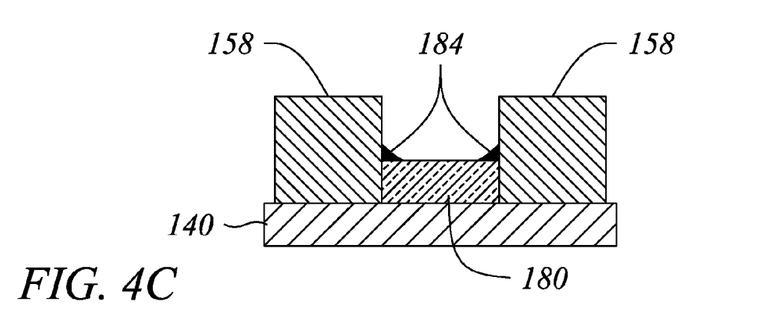

Forming 130 a catalyst nanoparticle in the targeted region further comprises evaporating the carrier fluid such that the catalyst accumulates against the sidewall of the structure in the targeted region. FIG. 4C illustrates a side view of the accumulated catalyst 184 against the sidewall 157 of the structure 158 in the targeted region after evaporation of the carrier fluid of FIG. 4B according to some embodiments. The catalyst 184 moves by way of capillary action to accumulate on the sidewall 157 in the targeted region just above the height or predetermined thickness of the sacrificial layer 180. In some embodiments, the catalyst 184 is annealed for at least the reasons set forth herein. For example, annealing improves adhesion of the catalyst to the sidewall of the structure. Moreover, annealing agglomerates the catalyst into nanoparticles in some embodiments. The catalyst is essentially the formed 130 catalyst nanoparticle according to these embodiments of the method 100 of positioning. Annealing may be performed either before or after the sacrificial layer 180 is removed, as further described below.

Figure 4D:
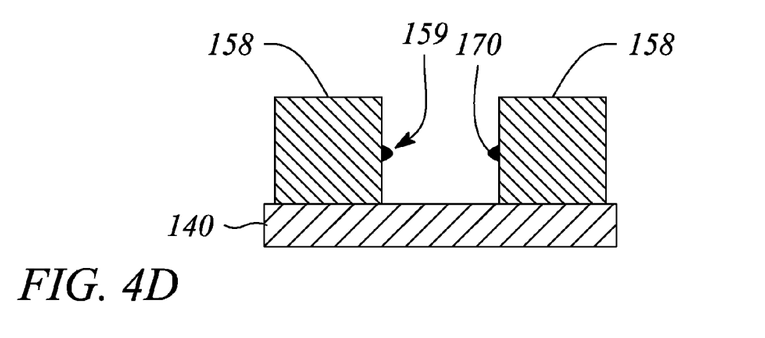

Forming 130 a catalyst nanoparticle in the targeted region further comprises removing the sacrificial layer 180 such that the catalyst remains accumulated on the sidewall in the targeted region. FIG. 4D illustrates a side view of the device structure with the sacrificial layer removed and the catalyst nanoparticle 170 formed 130 in the targeted region 159 according to some embodiments. In some embodiments, removing the sacrificial layer comprises using one or more of a solvent, a wet chemical etch and a dry etching technique to selectively remove the sacrificial layer 180 without damaging the substrate 140, the structure 158 or the catalyst 184, 170.

Either an organic material or an inorganic material that is selectively removable may be used as the sacrificial layer 180. In some embodiments, the material of the sacrificial layer 180 is selected from one of a polymer, such as a photoresist material, and an oxide material. In embodiments that include annealing the accumulated catalyst 184, the material of the sacrificial layer 180 may be chosen to withstand the temperatures and other conditions of annealing. In some embodiments, an inorganic sacrificial layer 180 including, but not limited to, silicon oxide and silicon nitride, is selectively removed with either a wet chemical etch or a dry etching technique (e.g., RIE or plasma etching).

For example, a silicon oxide sacrificial layer 180 is selectively removed with a hydrogen fluoride (HF) etch. A silicon nitride sacrificial layer 180 is selectively removed with a phosphoric acid etch, for example. In embodiments that employ an organic sacrificial layer 180 including, but not limited to, polymethylmethacrylate (PMMA) and a photoresist material, the organic sacrificial layer 180 also is selectively removed through one or more of a wet method, such as a wet chemical dissolution using a solvent, and a dry removal technique, such as RIE or plasma etching.

In another embodiment of the method 100 of positioning a catalyst nanoparticle, forming 120 a targeted region and forming 130 a catalyst nanoparticle in the targeted region are performed concurrently. In some embodiments, concurrently forming 120, 130 comprises directly depositing the catalyst nanoparticle in a predetermined location on the surface of the substrate using an inkjet print head. The inkjet print head is preprogrammed to locate the catalyst nanoparticle in the predetermined location. The predetermined location is a location in the targeted region, for example. In this embodiment, a catalyst material or the catalyst nanoparticle may be suspended in a carrier fluid that readily evaporates after the catalyst material or nanoparticle is deposited. In some embodiments, the deposited catalyst material or nanoparticle is annealed for any of the reasons provided above, such that the formed 130 catalyst nanoparticle remains adhered to the surface of the targeted region.

In other embodiments of the method 100 of positioning a catalyst nanoparticle, a targeted region and a catalyst nanoparticle in the targeted region are formed 120, 130 concurrently on the substrate using Langmuir-Blodgett deposition. In some embodiments, concurrently forming 120, 130 a targeted region and a catalyst nanoparticle comprises using a Langmuir-Blodgett technique to deposit preformed metal nanoparticles on the substrate surface. In some of these embodiments, the nanoparticles are floated on a liquid (i.e., subphase) and then compressed to ultimately form a uniform array of nanoparticles in the targeted region. The nanoparticles are transferred from the surface of the liquid to the substrate surface by pulling the substrate surface through the liquid. For example, silver (Ag) nanoparticles are floated on a water subphase. In some embodiments, a space on the substrate surface is provided between adjacent ones of the structure for concurrently forming 120, 130 a targeted region and the catalyst nanoparticles in the targeted region.

In some embodiments, using Langmuir-Blodgett deposition comprises coating metal nanoparticles with a relatively thick organic layer to control spacing of the nanoparticles. For example, the catalyst nanoparticles are formed in an array pattern on the substrate surface in the space provided between vertical sidewalls of the adjacent structures. The size of the array is partially dependent on the width of the provided space. If the space width is only moderately larger than the coated nanoparticles, a single row of nanoparticles forms near the center of the provided space, for example. According to some of these embodiments, using Langmuir-Blodgett deposition further comprises removing the organic coating; and annealing the metal nanoparticles to one or both of form and improve a connection to the substrate. The connection facilitates subsequent nanowire growth using the nanoparticle according to some embodiments.

In some embodiments, the method 100 of positioning a catalyst nanoparticle for nanowire growth further comprises growing a nanowire from the targeted region using the catalyst nanoparticle to facilitate catalytic nanowire growth. During catalytic growth, nanowires grow from the location of the nanoparticle catalyst in a predominately perpendicular direction to a plane of a suitably oriented surface. Under the most common growth conditions, nanowires grow in <111> directions with respect to a crystal lattice and therefore, grow predominately perpendicular to a (111) surface (of a crystal lattice). In some embodiments, the crystal orientation of the targeted region supports a predominantly perpendicular growth direction. Depending on whether the targeted region is located on the sidewall of the structure or the substrate surface, the nanowire will grow either predominantly laterally from the sidewall or predominantly vertically from the substrate surface, respectively. Nanowire growth is described in further detail below with respect to a method 200 of positioning a catalyst nanoparticle.

Figure 5:
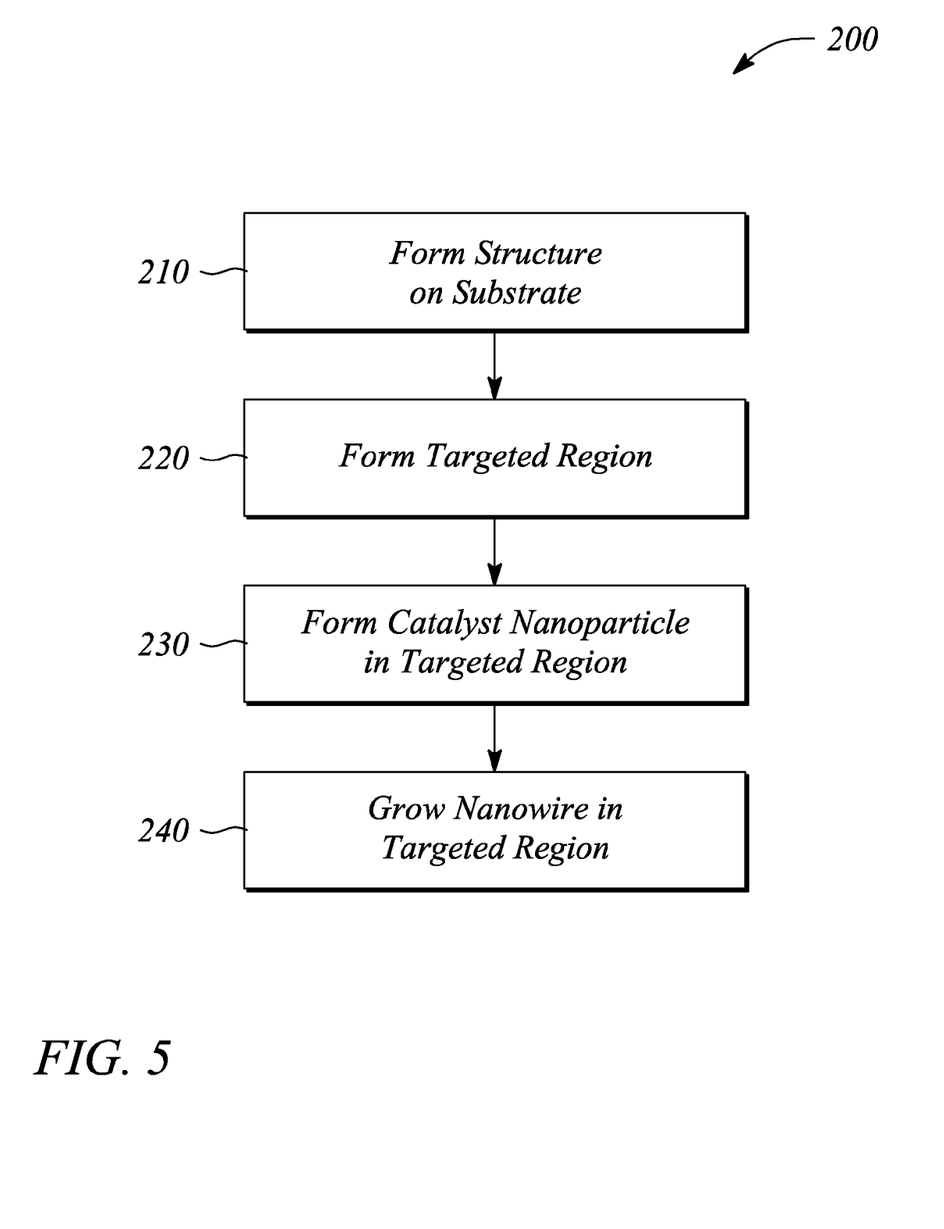
FIG. 5 illustrates a flow chart of a method of positioning a catalyst nanoparticle to grow a nanowire according to another embodiment of the present invention.

In another embodiment of the present invention, a method 200 of positioning a catalyst nanoparticle to grow a nanowire is provided. The method 200 of positioning a catalyst nanoparticle provides controlled positioning of a nanowire for nanowire-based device fabrication. FIG. 5 illustrates a flow chart of the method 200 of positioning a catalyst nanoparticle according to an embodiment of the present invention. The method 200 of positioning a catalyst nanoparticle comprises forming 210 a structure on a substrate. In some embodiments, forming 210 a structure on a substrate includes any of the embodiments described above of forming 110 a structure in the method 100 of positioning a catalyst nanoparticle.

As mentioned above, in some embodiments, the substrate is a semiconductor-on-insulator substrate that comprises a first semiconductor layer and an insulator layer. The structure is formed in the first semiconductor layer. In some embodiments, the substrate is the insulator layer. In other embodiments, the semiconductor-on-insulator substrate further comprises a second semiconductor layer and the substrate is the insulator layer and the second semiconductor layer. In these embodiments, the insulator layer electrically isolates the first semiconductor layer from the substrate (or second semiconductor layer).

The method 200 of positioning a catalyst nanoparticle further comprises forming 220 a targeted region on a respective surface of either the structure or the substrate. In some embodiments, forming 220 a targeted region includes any of the embodiments described above of forming 120 a targeted region in the method 100 of positioning a catalyst nanoparticle. As such, in some embodiments, the targeted region is formed 220 on a vertical sidewall surface of the structure, while in other embodiments, the targeted region is formed 220 on a horizontal surface of the substrate.

The method 200 of positioning a catalyst nanoparticle further comprises forming 230 a catalyst nanoparticle in the targeted region. In some embodiments, the targeted region and the catalyst nanoparticle are concurrently formed 220, 230. Any of the embodiments described above of forming 130 a catalyst nanoparticle in the method 100 of positioning a catalyst nanoparticle may be used in forming 230 a catalyst nanoparticle according to the method 200 of positioning a catalyst nanoparticle. As a result, either the structure or the substrate comprises a catalyst nanoparticle adhered to the respective surface to facilitate nanowire growth.

The method 200 of positioning a catalyst nanoparticle further comprises growing 240 a nanowire in the targeted region using the catalyst nanowire for catalytic nanowire growth. In general, nanowires are grown using a variety of techniques including, but not limited to, catalytic growth using vapor-liquid-solid (VLS) growth, catalytic growth using vapor-solid-solid growth, catalytic growth using solution-liquid-solid (SLS) growth, and non-catalytic growth using vapor-phase deposition. Catalytic growth is further characterized by being either metal catalyzed or nonmetal assisted growth. The growth is generally performed in a chemical vapor deposition (CVD) chamber in a controlled environment using a gas mixture comprising nanowire precursor materials. During catalytic growth, nanowires grow in a predominately perpendicular direction from a plane with a suitable crystal orientation.

In catalyzed growth, the nanowire essentially grows axially from a surface using a nucleating nanoparticle catalyst. Typical catalyst materials are metals and nonmetals. Metal catalyst materials include, but are not limited to, titanium (Ti), platinum (Pt), nickel (Ni), gold (Au), gallium (Ga), and alloys thereof. Nonmetal catalyst materials include, but are not limited to, silicon oxide ($SiO_x$), where x ranges from about 1 to less than 2, for example. Typical nanoparticle catalysts corresponding to Ti and Au catalyst materials, for example, are respectively titanium silicide ($TiSi_2$) and gold-silicon (Au—Si) alloy.

Nanowire growth is initiated in the CVD reaction chamber using both the catalyst nanoparticle from the respective surface and the gas mixture of the nanowire precursor material that is introduced into the chamber at a growth temperature. The catalyst nanoparticle accelerates decomposition of the nanowire precursor material in the gas mixture, such that adatoms resulting from decomposition of a particular gas containing a nanowire-forming material diffuse through or around the nanoparticle catalyst, and the adatoms precipitate on the underlying surface. In particular, the adatoms of the nanowire material precipitate between the nanoparticle catalyst and the surface to initiate nanowire growth. Moreover, catalyzed growth of the nanowire is continued with continued precipitation at the nanoparticle-nanowire interface. Such continued precipitation causes the nanoparticle to remain at the tip of the free end of the growing nanowire.

Materials used to grow a nanowire include, but are not limited to, metals, nonmetals and semiconductors and depend on the type of nanowire-based device that is to be fabricated. For example, the nanowire resonant element of a resonant sensor is either electrically conductive or electrically nonconductive, depending on one or both of the sensor application and the system used to monitor the nanowire resonant element.

In some embodiments, the nanowire is a semiconductor that is rendered electrically conductive by incorporating dopant atoms, such as boron or phosphorus, into the nanowires or at their surfaces. The dopant atoms may be incorporated by adding a dopant in a gas phase to the gas mixture in the CVD chamber during nanowire growth. For example, gaseous diborane ($B_2H_6$) or phosphine ($PH_3$) is added to the nanowire precursor gas mixture to achieve a level of electrical conductivity. In some embodiments, one or more of the structure, the substrate (or portions of either thereof) and the nanowire is rendered electrically conductive by adding one or more dopants using ion implantation or gas-phase diffusion, for example. In other embodiments, one or more of the structure, the substrate (or portions of either thereof) and the nanowire is coated with an electrically conductive material. In some embodiments, the respective material of one or more of the structure, the substrate (or portions of either thereof) and the nanowire is a metal material that is inherently electrically conductive.

Figure 6A:
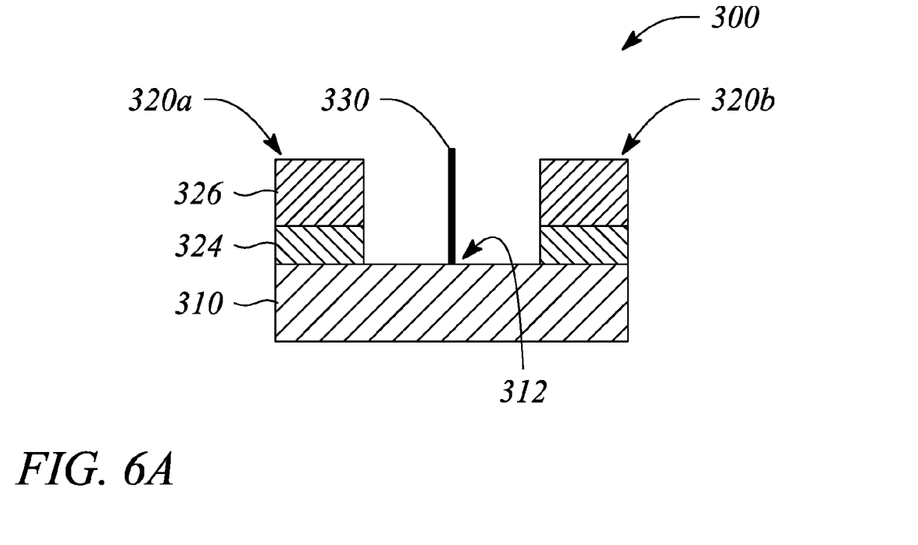
FIGS. 6A and 6B illustrate side views of a nanowire-based device according to various embodiments of the present invention.
Figure 6B:
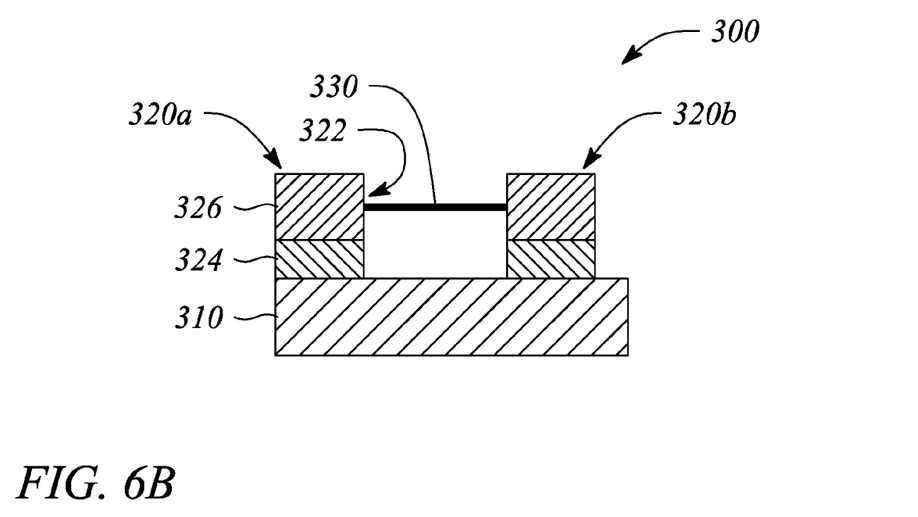

In another embodiment of the present invention, a nanowire-based device is provided. FIGS. 6A and 6B illustrate a nanowire-based device 300 according to various embodiments of the present invention. In FIGS. 6A and 6B, the nanowire-based device 300 comprises a substrate 310 having a first electrode 320a on the substrate 310. The electrode 320a has a vertically extending sidewall that comprises an insulator portion 324 and a non-insulator portion 326. The insulator portion 324 electrically isolates the electrode 320a from the substrate. In some embodiments, the nanowire-based device 300 further comprises a second electrode 320b adjacent to and spaced apart from the first electrode 320a on the substrate 310. FIGS. 6A and 6B illustrate the second electrode 320b by way of example.

The nanowire-based device 300 further comprises a nanowire element 330. In FIG. 6A, the nanowire element 330 extends predominantly vertically from a targeted region 312 of the substrate 310 surface. In this embodiment, the substrate comprises a semiconductor material. The nanowire element 330 is spaced from the first electrode 320a and when present, is spaced from the second electrode 320b. In some embodiments, the nanowire element 330 is taller than a height of at least one of the electrodes 320a, 320b.

In FIG. 6B, the nanowire element 330 extends predominantly laterally from a targeted region 322 of the first electrode 320a sidewall surface. The substrate material is one or both of a semiconductor material and an insulator material. In some embodiments (not illustrated), the nanowire element 330 has a free end opposite to an end anchored to the first electrode 320a (i.e., single-clamped nanowire-based device). In some embodiments, the nanowire element 330 connects between respective sidewall surfaces of the adjacent electrodes 320a, 320b, as illustrated (i.e., double-clamped nanowire-based device).

In some embodiments, the first electrode 320a and the substrate 310 are electrically conductive. In some embodiments, the first electrode 320a and the nanowire element 330 are electrically conductive. In some embodiments, the first electrode 320a and both the substrate 310 and the nanowire element 330 are electrically conductive. In some embodiments, the second electrode 320b is also present and is electrically conductive. The electrical conductivity imparted to the various parts of the nanowire-based device 300 facilitates electrically accessing the nanowire element 300, for example, one or both of actuating the nanowire element 330 and sensing a response of the nanowire element 330 is facilitated.

In some embodiments, the nanowire-based device 300 is manufactured using any of the embodiments described above for the method 200 of positioning a catalyst nanoparticle to facilitate nanowire growth. In some embodiments, the manufacturing method used to make the nanowire-based device 300 includes any of the embodiments described above for the method 100 of positioning a catalyst nanoparticle for nanowire growth. In some embodiments, the nanowire-based device 300 is manufactured on a semiconductor-on-insulator substrate. In these embodiments, the electrode structure 320a is formed from a first semiconductor layer 326 (a non-insulator portion) and the isolation between the electrode 320a and the substrate 310 is provided by an insulator layer 324 (an insulator portion) of the semiconductor-on-insulator substrate. In some embodiments, the substrate 310 is a second semiconductor layer 310 of the semiconductor-on-insulator substrate. The insulator layer 324 electrically isolates the first semiconductor layer 326 from the second semiconductor layer 310.

The nanowire-based device 300 includes, but is not limited to, an electron emitter, a periodic photonic structure, an optical emitter, an optical detector, a transistor and a sensor. In some embodiments, the nanowire-based device 300 is a field-effect sensor and the nanowire is a conducting element whose conductance is varied by the presence of the material to be sensed. In other embodiments, the nanowire-based device 300 is a resonant sensor and the nanowire is a resonant element (i.e., resonator) thereof.

Figure 7:
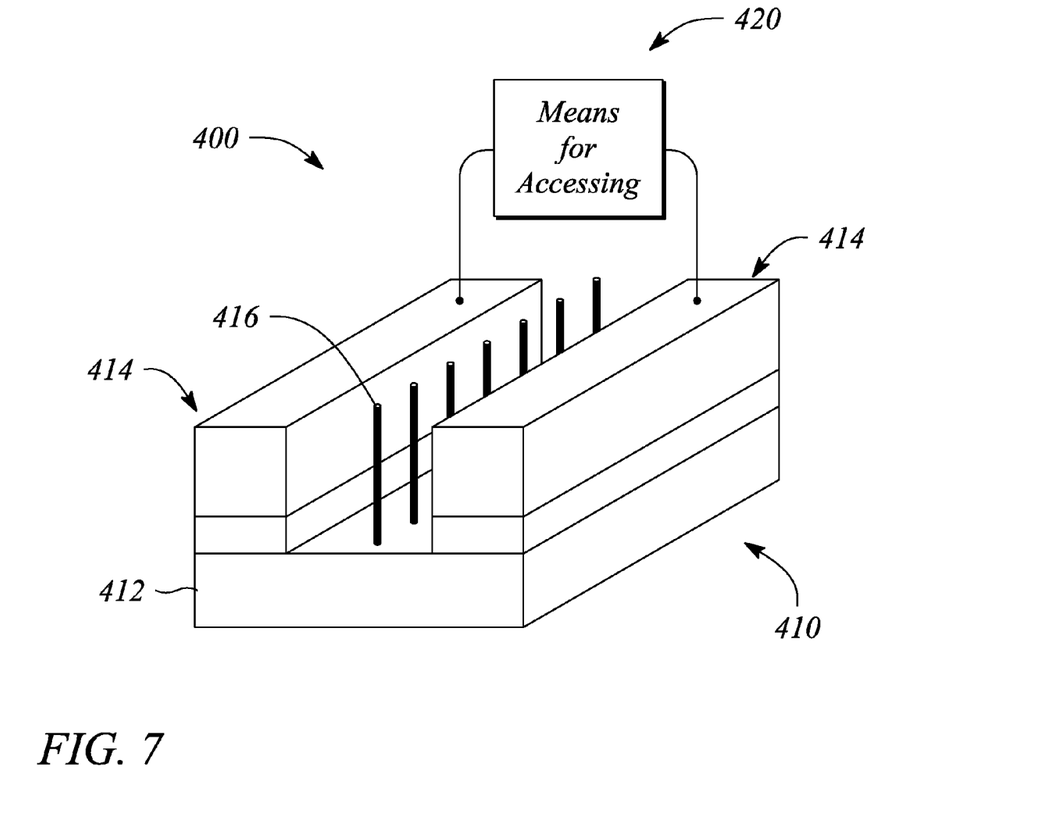
FIG. 7 illustrates a perspective view of a resonant sensor system that employs a nanowire-based sensing device according to another embodiment of the present invention.

FIG. 7 is a perspective view of resonant sensor system 400 according to another embodiment of the present invention. The resonant sensor system 400 comprises a nanowire-based resonant sensor 410 and means 420 for accessing the nanowire. The resonant sensor 410 comprises a substrate 412, a pair of electrodes 414, and a nanowire 416, which is a resonant element (or resonator) of the sensor 410. The electrodes 414 are spaced apart on the substrate 412. In some embodiments, the resonant sensor 410 comprises a plurality of nanowires 416 and in some embodiments, the resonant sensor 410 may comprise only one electrode 414. The length of the nanowire 416 may be greater than the height of at least one of the electrodes 414. In some embodiments, the resonant sensor 410 is essentially the nanowire-based device 300 according to any of the embodiments described above.

The means 420 for accessing the nanowire (i.e., accessing means 420) comprises one or both of means for actuating the nanowire 416 and means for detecting (sensing) change in the nanowire 416. In some embodiments, the accessing means 420 is electrically connected between the pair of electrodes 414 that are spaced from the nanowire 416 as illustrated in FIG. 7. In other embodiments, the accessing means 420 is electrically connected between one of the electrodes 414 and one or both of the substrate 412 and the nanowires 416, for example. An electrical signal applied between the electrodes 414, or between one or both of the electrodes 414 and the substrate 412, wherein the substrate 412 is electrically connected to the nanowires 416, actuates the nanowires 416 and causes them to vibrate.

In some embodiments, the accessing means 420 comprises a voltage source and a detector. For example, the voltage source may apply a time varying voltage to the adjacent electrodes 414 to actuate the nanowires 416 and the detector may detect a deviation in the time varying voltage induced by the nanowires 416 responding to an environmental condition. In another example, a capacitance sensor is used as the detector portion of the accessing means 420. The capacitance sensor measures a change in capacitance of the nanowires 416, which is induced by a movement of the nanowires 416. In other embodiments, an energy absorption sensor is used as the detector portion of the accessing means 420. Energy absorption may be monitored at or near a resonant frequency of the oscillations. Both the capacitance sensor and the energy absorption sensor monitor the environment or the surface of the nanowire 416 for changes in the nanowire 416, such as changes in oscillatory movement thereof, which affect capacitance measurements or energy absorption.

In some embodiments, the nanowire 416 has a controlled surface. As used herein, the term 'controlled surface' refers to a surface that is prepared or modified for adsorption and desorption of numerous species of interest including, but not limited to, atoms, ions, molecules, chemical complexes, biological complexes. The controlled surface may have one of receptors established thereon; a predetermined atomic composition, a predetermined nanostructure, and combinations thereof. The predetermined atomic composition include, but is not limited to, oxides, nitrides, hydrogen terminated coatings, inorganic monolayer coatings, organic monolayer coatings, and combinations thereof. The predetermined nanostructure includes, but is not limited to, porous silicon shell, packed monolayer, and dense thermal oxide.

In an embodiment, one or more receptors are established as a coating on the nanowire 416 to provide the nanowire 416 with a controlled surface. The receptors are incorporated into the resonant sensor system 400 to functionalize the nanowire 416 for preferential and/or differential adsorption and desorption of one or more target detection species. As such, the receptor(s) selected may be dependent upon, at least in part, the target species. Non-limiting examples of suitable receptors include electron acceptors, electron donors, aromatic materials, polar groups, bioreceptors, bioactive receptors, charged species, and combinations thereof.

The receptors, the atomic composition, the nanostructure (e.g., nano-scale texture), or combinations thereof may be selected to obtain a desirable controlled surface. It is to be understood that one or both of the atomic composition and the nanostructure of the receptors may also be controlled so that one or more target detection species will adsorb on, and desorb from, the receptors. Further, it is to be understood that in addition to receptors, or as an alternative to including receptors, one or both of the atomic composition and the nanostructure of the nanowire 416 may be controlled so that one or more target species will adsorb on, and desorb from, the controlled surface.

Thus, there have been described various embodiments of a method of positioning a catalyst nanoparticle for nanowire growth that may be used to fabricate a nanowire-based device. Also described herein are various embodiments of a nanowire-based device and a resonant sensor system that employs a nanowire-based resonant sensing device. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method of positioning a catalyst nanoparticle on a surface for nanowire growth, the method comprising:
   forming a structure on a substrate, the structure having a sidewall that extends vertically from the substrate; forming a targeted region on a respective surface of either the sidewall of the structure or the substrate using a metal oxide layer coated on the respective surface; and forming a catalyst nanoparticle in the targeted region,
   wherein forming a target region comprises selectively reducing metal oxide of the metal oxide layer to a metal catalyst nanoparticle surrounded by and in contact with the metal oxide layer.

2. The method of positioning of claim 1, wherein forming a targeted region using a metal oxide layer comprises:
   coating one or both of the sidewall of the structure and the substrate surface with a layer of a metal oxide, and
   wherein forming a catalyst nanoparticle in the targeted region comprises reducing a predetermined area of the metal oxide layer to a metal, the predetermined area being the targeted region, the metal being the formed catalyst nanoparticle in the targeted region.

3. The method of positioning of claim 1, further comprising growing a nanowire in the targeted region using the formed catalyst nanoparticle.

4. The method of positioning of claim 1, wherein forming the catalyst nanoparticle comprises selectively reducing a portion of the metal oxide layer only within the targeted region to produce a metal, the catalyst nanoparticle being formed exclusively from the produced metal.

5. A method of positioning a catalyst nanoparticle on a surface for nanowire growth, the method comprising:
   forming a structure on a substrate, the structure having a sidewall that extends vertically from the substrate;
   forming a targeted region on a respective surface of either the sidewall of the structure or the substrate using a selectively removable passivation layer; and
   forming a catalyst nanoparticle in the targeted region,
   wherein forming a targeted region comprises:
   forming an island of a material on either the sidewall of the structure or the substrate surface, the material of the island being different from materials of both the structure and the substrate;
   forming a passivation layer on both the island and respective surfaces of the structure and the substrate, the passivation layer on the island being different from the passivation layer on the respective surfaces; and
   selectively removing the passivation layer from the island to an exclusion of the passivation layer on the respective surfaces of both the structure and the substrate, and
   wherein forming an island comprises:
   depositing a wetting layer comprising a number of monolayers of the island material on the respective surface; and
   subsequently depositing an additional number of monolayers of the island material on the wetting layer, wherein the island material has a lattice mismatch relative to a lattice of a respective material of one or both of the structure and the substrate.

6. The method of positioning of claim 5, wherein forming a catalyst nanoparticle in the targeted region comprises:
   selectively depositing a catalyst on the passivation-removed island excluding the respective passivation-covered surfaces of both the structure and the substrate.

7. The method of positioning of claim 6, wherein selectively depositing a catalyst comprises electrochemically depositing a metal catalyst on the passivation-removed island.

8. The method of positioning of claim 5, further comprising deliberately forming surface irregularity on the respective surface, wherein the wetting layer is preferentially deposited on the surface irregularity.

9. The method of positioning of claim 5, wherein the passivation layer comprises an oxide layer.

10. A method of positioning a catalyst nanoparticle on a surface for nanowire growth, the method comprising:
    forming a structure on a substrate, the structure having a sidewall that extends vertically from the substrate;
    forming a targeted region on a respective surface of either the sidewall of the structure or the substrate using a selectively removable passivation layer; and
    forming a catalyst nanoparticle in the targeted region,
    wherein forming a targeted region comprises:
    forming a passivation layer on both the sidewall of the structure and on the substrate, the sidewall comprising end surfaces of a stack of material layers, at least a second layer of the stack is a different material from materials of a first layer and a third layer of the stack and of the substrate, the second layer being between the respective first and third layers;
    selectively removing the passivation layer from the end surface of the second layer to an exclusion of the end surfaces of the respective first and third layers and the substrate surface; and
    wherein forming a catalyst nanoparticle in the targeted region comprises:
    selectively depositing a catalyst on the passivation-removed end surface of the second layer to the exclusion of the passivation-covered surfaces of the respective first and third layers and the substrate.

11. The method of positioning of claim 10, wherein selectively depositing a catalyst comprises electrochemically depositing a metal catalyst on the passivation-removed end surface of the second layer.

12. The method of positioning of claim 10, wherein forming a structure on a substrate comprises:
    forming the first layer, the second layer and the third layer in the stack on the substrate, the first layer being adjacent to the substrate, the first layer material being either the same as or different from the third layer material, the substrate being either the same as or different from one of the first layer material and the third layer material; and
    forming the structure in the stack of layers such that exposed end surfaces of the first, second and third respective layers form the sidewall of the structure, the surface of the substrate being exposed by forming the structure in the stack,
    wherein at least the first layer and the second layer independently have targeted thicknesses, the targeted thickness of the first layer representing a height on the sidewall above which is the targeted region, the targeted thickness of the second layer representing a dimension of the targeted region on the sidewall.

13. The method of positioning of claim 10, wherein the passivation layer comprises an oxide.

14. A method of positioning a catalyst nanoparticle on a surface for nanowire growth, the method comprising:
    forming a structure on a substrate, the structure having a sidewall that extends vertically from the substrate;
    forming a targeted region on a respective surface of either the sidewall of the structure or the substrate using a selectively removable sacrificial layer; and
    forming a catalyst nanoparticle in the targeted region,
    wherein forming a targeted region comprises:
    forming a sacrificial layer of a material on the substrate surface against the sidewall of the structure, the sacrificial layer having a predetermined thickness, the predetermined thickness of the sacrificial layer representing a height on the sidewall of the structure above which is the targeted region, and;

wherein forming a catalyst nanoparticle in the targeted region comprises:

depositing a catalyst in a carrier fluid on the sacrificial layer;

evaporating the carrier fluid such that the catalyst accumulates against the sidewall above the height; and removing the sacrificial layer such that the catalyst remains on the sidewall in the targeted region.

15. A method of positioning a catalyst nanoparticle on a surface to grow a nanowire, the method comprising:

forming a structure on a substrate, the structure having a sidewall that extends vertically from the substrate;

forming a targeted region on a respective surface of either the sidewall of the structure or the substrate using a metal oxide layer, wherein forming a targeted region comprises depositing a layer of a metal oxide material on the respective surface, and controllably reducing a minute location of the metal oxide material to a respective metal of the metal oxide material, wherein controllably reducing a minute location concurrently forms the targeted region and a catalyst nanoparticle of the respective metal in the targeted region, and wherein the formed catalyst nanoparticle is surrounded by and in contact with the metal oxide layer.

16. The method of positioning a catalyst nanoparticle of claim 15, wherein controllably reducing minute locations comprises using electron beam lithography or a laser to concurrently form the targeted region and the catalyst nanoparticle of the respective metal in the targeted region, the targeted region being surrounded by the metal oxide material.

* * * * *